US010403658B2

(12) United States Patent
Takada et al.

(10) Patent No.: US 10,403,658 B2
(45) Date of Patent: Sep. 3, 2019

(54) IMAGE SENSING DEVICE AND MOVING APPARATUS

(71) Applicant: CANON KABUSHIKI KAISHA, Tokyo (JP)

(72) Inventors: Yoshiaki Takada, Kawasaki (JP); Kazuo Yamazaki, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 15/921,976

(22) Filed: Mar. 15, 2018

(65) Prior Publication Data

US 2018/0277578 A1 Sep. 27, 2018

(30) Foreign Application Priority Data

Mar. 24, 2017 (JP) ................. 2017-059690

(51) Int. Cl.
*H01L 27/146* (2006.01)

(52) U.S. Cl.
CPC .. *H01L 27/14609* (2013.01); *H01L 27/14643* (2013.01); *G09G 2310/0264* (2013.01)

(58) Field of Classification Search
CPC ........ H01L 27/14609; H01L 27/14643; G09G 2310/0264
See application file for complete search history.

(56) References Cited

U.S. PATENT DOCUMENTS

| | | |
|---|---|---|
| 8,049,799 B2 | 11/2011 | Sonoda et al. |
| 8,325,260 B2 | 12/2012 | Yamazaki et al. |
| 8,760,337 B2 | 6/2014 | Yamazaki |
| 9,060,139 B2 | 6/2015 | Yamazaki |
| 9,288,415 B2 | 3/2016 | Yamazaki et al. |
| 9,407,847 B2 | 8/2016 | Maehashi et al. |
| 9,426,391 B2 | 8/2016 | Takada et al. |
| 9,509,931 B2 | 11/2016 | Kobayashi et al. |
| 9,627,423 B2 | 4/2017 | Takada et al. |
| 9,667,901 B2 | 5/2017 | Sakai et al. |
| 9,681,076 B2 | 6/2017 | Oguro et al. |
| 9,762,840 B2 | 9/2017 | Yamazaki et al. |
| 2007/0001148 A1* | 1/2007 | Adachi ............. G02F 1/136277 252/299.63 |
| 2007/0164967 A1* | 7/2007 | Osame ................. G09G 3/3233 345/98 |
| 2015/0021461 A1* | 1/2015 | Nishihara ......... H01L 27/14609 250/208.1 |

(Continued)

FOREIGN PATENT DOCUMENTS

JP 2015-070591 A 4/2015

*Primary Examiner* — Julia Slutsker

(74) *Attorney, Agent, or Firm* — Venable LLP

(57) ABSTRACT

An image sensing device includes pixels forming rows and columns, sets of control lines respectively assigned to the rows such that one set of control lines is connected to one of the rows, a row drive circuit configured to drive the sets of control lines, and an assist circuit. Each set includes a first control line and a second control line. The row drive circuit includes a first drive circuit connected to a first end of the first control line and a second drive circuit connected to first end of the second control line. The assist circuit includes an assist drive circuit connected to a second end of the first control line so as to drive the first control line in accordance with a control signal supplied to the second control line.

23 Claims, 7 Drawing Sheets

(56) References Cited

U.S. PATENT DOCUMENTS

2016/0211299 A1 7/2016 Arita
2017/0310913 A1 10/2017 Takada et al.
2018/0288347 A1* 10/2018 Komai .................... H03M 1/56

* cited by examiner

IMAGE SENSING DEVICE AND MOVING APPARATUS

BACKGROUND OF THE INVENTION

Field of the Invention

The present invention relates to an image sensing device and a moving apparatus.

Description of the Related Art

Japanese Patent Laid-Open No. 2015-70591 describes an image sensing device formed by a first substrate and a second substrate. The first substrate includes a pixel portion with a plurality of pixels. The second substrate includes a first vertical scanning circuit and a second vertical scanning circuit arranged so as to sandwich a region immediately below the pixels, and a first buffer and a second buffer arranged in the region immediately below the pixels. A control signal output from the first buffer is supplied to a pixel close to the first buffer out of the plurality of pixels arranged on the same row of the pixel portion. A control signal output from the second buffer is supplied to a pixel close to the second buffer out of the plurality of pixels arranged on the same row of the pixel portion. The control signals output from the first buffer and second buffer are supplied to a pixel arranged at the center out of the plurality of pixels arranged on the same row of the pixel portion. In the image sensing device described in Japanese Patent Laid-Open No. 2015-70591, a shift in supply timing of the control signals to the plurality of pixels arranged on the same row is reduced by the above arrangement.

The image sensing device described in Japanese Patent Laid-Open No. 2015-70591 includes the first and second vertical scanning circuits arranged so as to sandwich the region immediately below the pixels, increasing an overall circuit scale and the size of the image sensing device.

SUMMARY OF THE INVENTION

The present invention provides a technique advantageous in suppressing an increase in size of an image sensing device while reducing a difference in timing at which signals reach a plurality of pixels arranged on the same row.

One of the aspects of the present invention provides an image sensing device comprising: a plurality of pixels arrayed so as to form a plurality of rows and a plurality of columns; a plurality of sets of control lines respectively assigned to the plurality of rows such that one set of control lines is connected to one of the plurality of rows; a row drive circuit configured to drive the plurality of sets of control lines; and an assist circuit, wherein each set of the plurality of sets of control lines includes a first control line and a second control line, the row drive circuit includes a first drive circuit connected to a first end of the first control line and a second drive circuit connected to a first end of the second control line, and the assist circuit includes an assist drive circuit connected to a second end of the first control line so as to drive the first control line in accordance with a control signal supplied to the second control line.

Further features of the present invention will become apparent from the following description of exemplary embodiments with reference to the attached drawings.

DESCRIPTION OF THE EMBODIMENTS

The present invention will now be described with reference to the accompanying drawings by way of embodiments.

Figure 1:
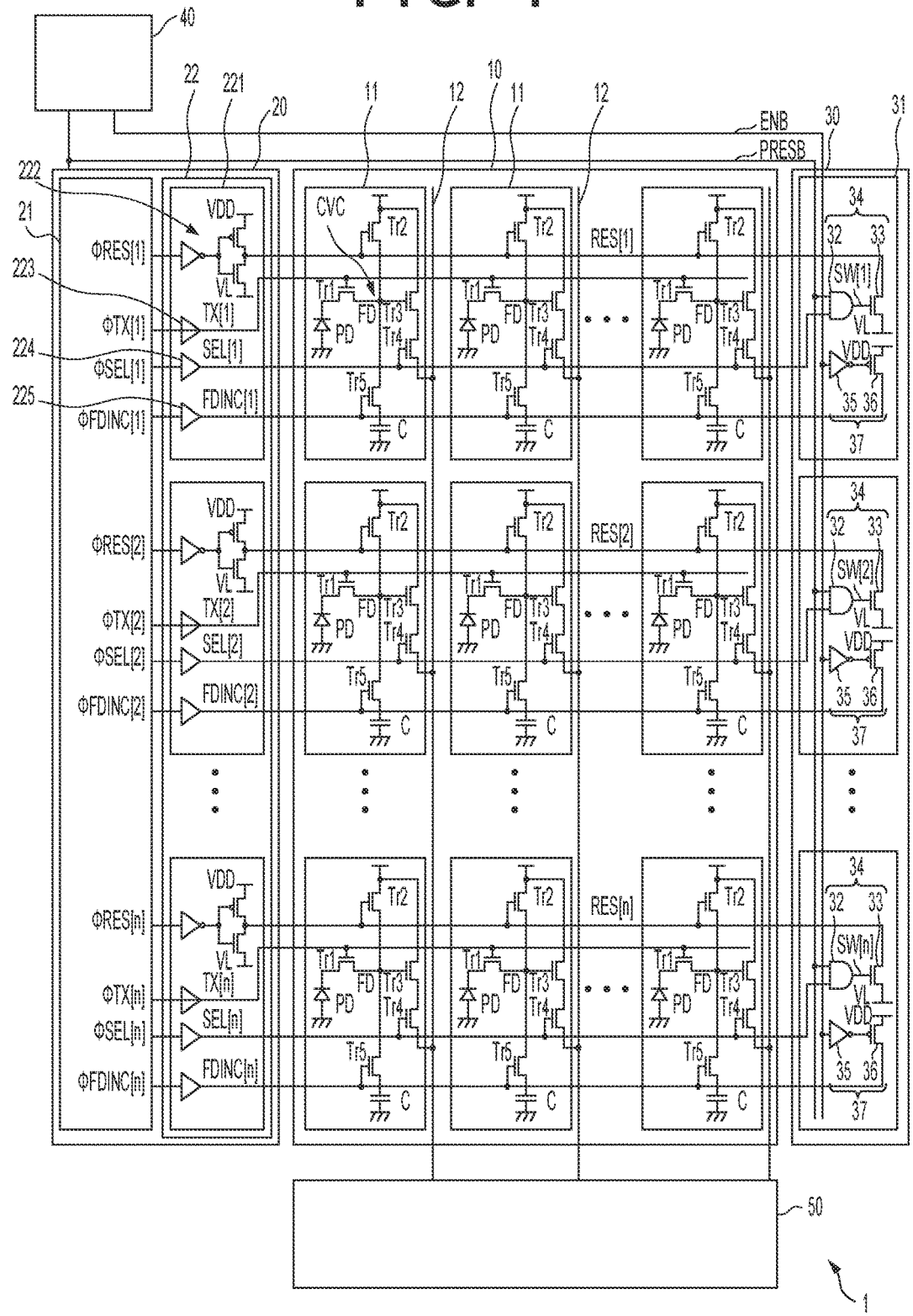
FIG. 1 is a circuit diagram showing the arrangement of an image sensing device according to a first embodiment of the present invention.

FIG. 1 shows the arrangement of an image sensing device 1 according to the first embodiment of the present invention. The image sensing device 1 can include a pixel array 10, a row drive circuit 20, an assist circuit 30, a control circuit 40, and a readout circuit 50. The pixel array 10 includes a plurality of pixels 11 arrayed so as to form a plurality of rows and a plurality of columns. Each pixel 11 can include a photoelectric converter PD, a charge voltage converter CVC, a transfer portion Tr1 that transfers charges generated in the photoelectric converter PD to the charge voltage converter CVC, and a reset portion Tr2 that resets the voltage of the charge voltage converter CVC.

Each photoelectric converter PD can be formed by, for example, a photodiode. Each charge voltage converter CVC can include a charge voltage conversion node FD, a switch Tr5 configured to change the capacitance of the charge voltage conversion node FD, and a capacitance C. When the switch Tr5 is turned on, the capacitance C is connected to the charge voltage conversion node FD, increasing the capacitance of the charge voltage conversion node FD. That is, the pixel 11 is set in a low sensitivity mode when the switch Tr5 is turned on, and the pixel 11 is set in a high sensitivity mode when the switch Tr5 is turned off. The capacitance of the charge voltage conversion node FD means a capacitance between the charge voltage conversion node FD and a predetermined voltage (for example, a ground voltage).

Each transfer portion Tr1 can be formed by a gate electrode that forms a channel in a semiconductor region between the photoelectric converter PD and the charge voltage converter CVC. Alternatively, it is also possible to understand that the transfer portion Tr1 is formed by a MOS transistor. The transfer portion Tr1 forms the channel in the semiconductor region by activating a transfer control signal ΦTX[i] supplied to the gate electrode and transfers the charges generated in the photoelectric converter PD to the charge voltage converter CVC via this channel. Each reset portion Tr2 can be formed by a MOS transistor. The reset portion Tr2 resets the voltage of the charge voltage converter CVC by activating a reset control signal ΦRES[i] supplied to the gate electrode of the MOS transistor.

Each pixel 11 can also include an amplification portion Tr3 that outputs a signal according to the voltage of the charge voltage converter CVC to a column signal line 12 and a selection portion Tr4 configured to set the pixel 11 in a selected state or an unselected state. The amplification portion Tr3 can be formed by a MOS transistor with the gate electrode being connected to the charge voltage converter CVC (charge voltage conversion node FD) and form a source follower circuit with a current source (not shown) connected to the column signal line 12. The selection portion Tr4 can be formed by a MOS transistor. The selection portion Tr4 sets the amplification portion Tr3 in an operating state (a state in which the amplification portion Tr3 can drive the column signal line 12) by activating a select control line ΦSEL[i] supplied to the gate electrode of the MOS transistor.

The row drive circuit 20 drives a plurality of sets of control lines, respectively, assigned to the plurality of rows of the pixel array 10. The set of control lines assigned to each row can include, for example, a reset control line RES[i], a transfer control line TX[i], a select control line SEL[i], and a sensitivity control line FDINC[i] (i indicates a row number from 1 to n). The row drive circuit 20 generates a set of control signals to be supplied to each of the plurality of sets of control lines. The set of control signals can include, for example, the reset control signal ΦRES[i], the transfer control signal ΦTX[i], the select control signal ΦSEL[i], and a sensitivity control signal ΦFDINC[i]. The reset control signal ΦRES[i] is supplied to the reset control line RES[i]. The transfer control signal ΦTX[i] is supplied to the transfer control line TX[i]. The select control signal ΦSEL[i] is supplied to the select control line SEL[i]. The sensitivity control signal ΦFDINC[i] is supplied to the sensitivity control line FDINC[i].

The row drive circuit 20 can include a row selection circuit 21 (for example, a vertical scanning circuit) that generates a plurality of sets of control signals and a buffer circuit group 22 that buffers the plurality of sets of control signals generated by the row selection circuit 21. Note that the plurality of sets of control signals output from the row selection circuit 21 and the plurality of sets of control signals output from the buffer circuit group 22 have the same logic level, and thus the two are denoted by the same signal name. For example, both the reset control signal output from the row selection circuit 21 and the reset control signal output from the buffer circuit group 22 are denoted by ΦRES[i]. The buffer circuit group 22 includes a plurality of buffer circuits 221. One buffer circuit 221 corresponds to one row.

The buffer circuit group 22 includes buffer circuits 222, 223, 224, and 225. The buffer circuit 222 (first drive circuit) is connected to a first end of the reset control line RES[i] (first control line) so as to drive the reset control line RES[i]. The buffer circuit 222 (first drive circuit) sets the reset control signal ΦRES[i] at a first voltage VDD (power supply voltage) of high logic level when activating the reset control signal ΦRES[i]. In addition, the buffer circuit 222 (first drive circuit) sets the reset control signal ΦRES[i] at a second voltage VL (a voltage lower than the first voltage, for example, the ground voltage) of low logic level when deactivating the reset control signal ΦRES[i].

The buffer circuit 223 is connected to first end of the transfer control line TX[i] so as to drive the transfer control line TX[i]. The buffer circuit 224 (second drive circuit) is connected to a first end of the select control line SEL[i] (second control line) so as to drive the select control line SEL[i]. The buffer circuit 225 (third drive circuit) is connected to first end of the sensitivity control line FDINC[i] (third control line) so as to drive the sensitivity control line FDINC[i].

The assist circuit 30 includes a plurality of row assist circuits 31 corresponding to the first to nth rows, respectively. Each row assist circuit 31 can include an assist drive circuit 34. In other words, the assist circuit 30 can include the plurality of assist drive circuits 34 corresponding to the first row to the nth row, respectively. Each assist drive circuit 34 is connected to the second end of the reset control line RES[i] (first control line) so as to drive the reset control line RES[i] in accordance with the select control signal ΦSEL[i] (second control signal) supplied to the select control line SEL[i] (second control line). The assist drive circuits 34 are provided for the plurality of rows (that is, the first row to the nth row) of the pixel array 10. Each assist drive circuit 34 can drive the reset control line RES[i] (first control line) in accordance with a time duration signal PRESB in addition to the select control signal ΦSEL[i] (second control signal). The time duration signal PRESB is a signal that defines a period in which each assist drive circuit 34 drives the reset control line RES[i] (first control line). The assist drive circuit 34 can include, for example, an AND circuit 32 and a MOS transistor 33. The AND circuit 32 outputs a logical product between the select control signal ΦSEL[i] and the time duration signal PRESB as a drive signal SW[i]. In the MOS transistor 33, the drive signal SW[i] is supplied to the gate electrode, the second voltage VL (a node that supplies the second voltage VL) is supplied to the source electrode, and the drain electrode is connected to the reset control line RES[i] (first control line). Each assist drive circuit 34 drives the reset control line RES[i] (first control line) from the first voltage VDD to the second voltage VL when the buffer circuit 222 (first drive circuit) drives the reset control line RES[i] (first control line) from the first voltage VDD to the second voltage VL.

Each row assist circuit 31 can include a second assist drive circuit 37. In other words, the assist circuit 30 can include the plurality of second assist drive circuits 37 corresponding to the first row to the nth row, respectively. Each of the plurality of second assist drive circuits 37 is connected to the second end of the sensitivity control line FDINC[i] (third control line) so as to drive the sensitivity control line FDINC[i] of a corresponding set of drive lines out of a plurality of sets of drive lines. The plurality of second assist drive circuits 37 drive the sensitivity control lines FDINC[i] (third control lines) of the plurality of sets of drive lines to the first voltage VDD in response to a control signal ENB commonly supplied to the plurality of second assist drive circuits 37. Each second assist drive circuit 37 can include, for example, an inverter 35 to which the control signal ENB is supplied and a MOS transistor 36 driven by the inverter 35. In the MOS transistor 36, the gate electrode is connected to the output terminal of the inverter 35, the first voltage VDD is supplied to the source electrode, and the drain electrode is connected to the sensitivity control line FDINC[i]. Each second assist drive circuit 37 drives the sensitivity control line FDINC[i] (third control line) from the second voltage VL to the first voltage VDD when the buffer circuit 225 (third drive circuit) drives the sensitivity control line FDINC[i] (third control line) from the second voltage VL to the first voltage VDD.

The control circuit 40 generates the aforementioned time duration signal PRESB and control signal ENB, and supplies them to the assist circuit 30, in addition to generating a control signal for controlling the row drive circuit 20 and supplying it to the row drive circuit 20. The readout circuit 50 reads out the signals of the plurality of pixels 11 on the row selected by the row drive circuit 20 via the plurality of column signal lines 12. The readout circuit 50 can include, for example, a plurality of column amplifiers, respectively, corresponding to the plurality of column signal lines 12, a holding circuit that holds a plurality of signals read out by the plurality of column amplifiers, a horizontal selection circuit (column selection circuit), and the like.

Figure 2:
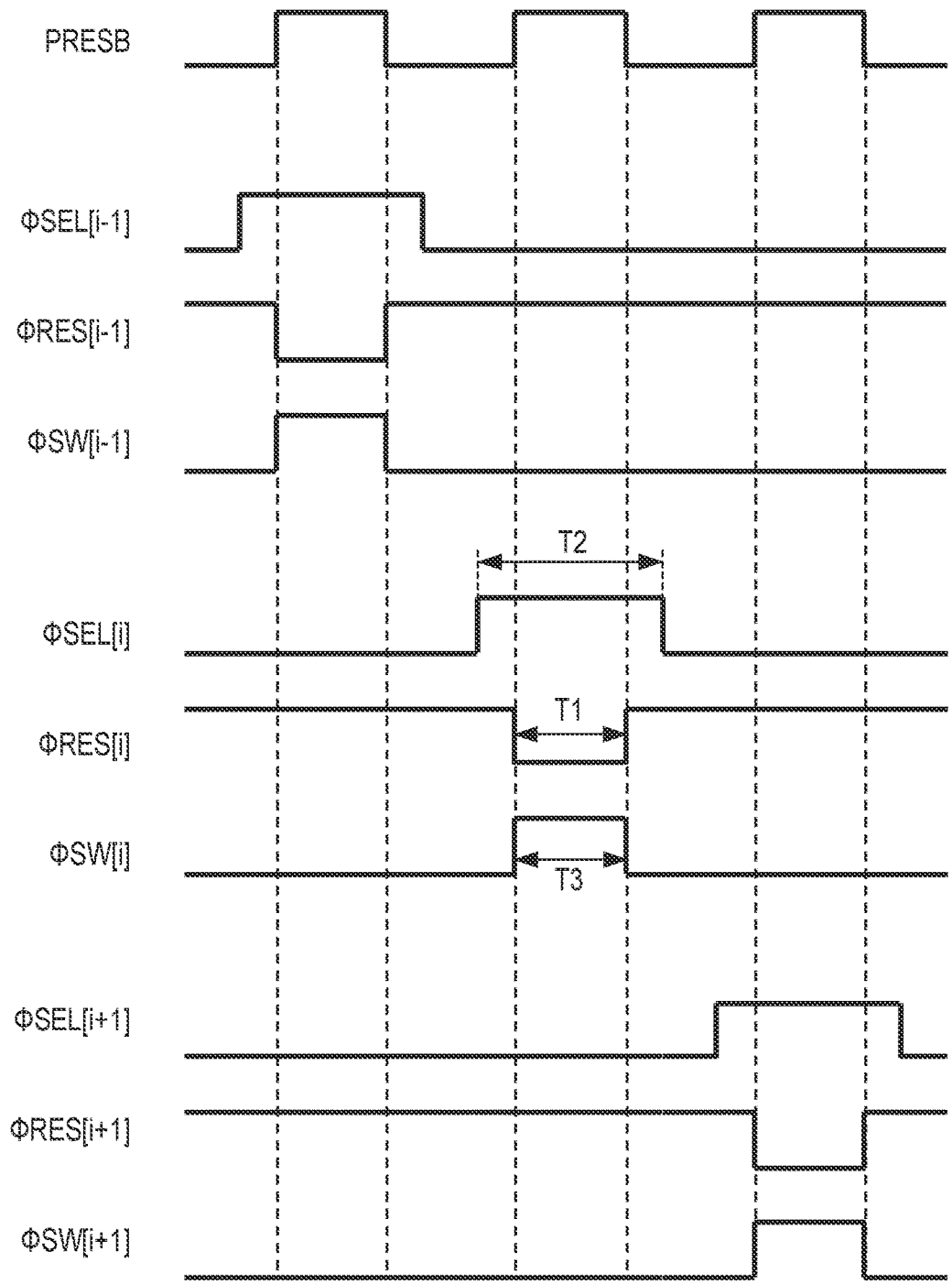
FIG. 2 is a timing chart showing a time duration signal PRESB, select control signals ΦSEL, reset control signals ΦRES, and select control signals ΦSW.

FIG. 2 shows the time duration signal PRESB, the select control signals ΦSEL, the reset control signals ΦRES, and the selection control signals ΦSW when the signals are read out from the pixels 11 on the (i−1)th row, the ith row, and the (i+1)th row of the pixel array 10. Note that the transfer control signals ΦTX are not illustrated.

When the signals are read out from the pixels 11 on the ith row of the pixel array 10, the buffer circuit 224 on the ith row activates the select control signal ΦSEL[i] (second control signal) on the ith row for a second period T2. The select control signal ΦSEL[i] can be understood as the second pulse signal for defining the second period T2. After the select control signal ΦSEL[i] (second control signal) on the ith row is activated, the buffer circuit 222 on the ith row activates the reset control signal ΦRES[i] (first control signal) on the ith row for a first period T1. The reset control signal ΦRES[i] can be understood as the first pulse signal for defining the first period T1. Note that the entire first period T1 can belong to the second period T2.

The time duration signal PRESB can be a signal activated for a third period T3 for each of the first row to the nth row. The time duration signal PRESB can be understood as the third pulse signal for defining the third period T3. The entire third period T3 can belong to the second period T2. The third period T3 is preferably set equal to the first period T1. In other words, the time duration signal PRESB is preferably activated when the respective ΦRES[i] (i=1 to n) are activated.

The AND circuit 32 of each assist drive circuit 34 outputs a logical product between the select control signal ΦSEL[i] and the time duration signal PRESB as the drive signal SW[i]. In the first period T1, the drive signal SW[i] is activated, and the MOS transistor 33 drives the reset control line RES[i] to the second voltage VL. Therefore, when the signals are read out from the pixels 11 on the ith row of the pixel array 10, both the buffer circuit 222 on the ith row and the assist drive circuit 34 on the ith row drive the reset control line RES[i] on the ith row to the second voltage VL in the first period T1. This makes it possible to deactivate, at a high speed, each reset portion Tr2 that resets the charge voltage converter CVC of the pixel 11 on the ith row (that is, a row to be read out). This is advantageous in order to reduce a time needed to read out the signal from the pixel 11 on the ith row (that is, the row to be read out). It is also possible to reduce a difference in timing of reset cancellation between the plurality of pixels 11 on the ith row by driving the reset control line RES[i] on the ith row to the second voltage VL by the buffer circuit 222 on the ith row and the assist drive circuit 34 on the ith row. Such driving is advantageous in reducing crosstalk between the adjacent rows.

According to the above arrangement, the assist drive circuit 34 on the ith row is operated in accordance with the select control signal ΦSEL[i] on the ith row, and thus a decoder need not be provided in order to select the assist drive circuit 34 to be operated out of the plurality of assist drive circuits 34. It is therefore possible to suppress an increase in size of the image sensing device 1 resulting from providing the assist circuit 30 (assist drive circuits 34).

The signals are read out from the pixels 11 on the ith row by activating the transfer control signal ΦTX[i] on the ith row after the select control signal ΦSEL[i] on the ith row is activated, and the reset control signal ΦRES[i] on the ith row is deactivated. By activating the transfer control signal ΦTX[i] on the ith row, in each pixel 11 on the ith row, charges are transferred from the photoelectric converter PD to the charge voltage converter CVC, and the amplification portion Tr3 outputs a signal according to the charges transferred to the charge voltage converter CVC to the column signal line 12. The readout circuit 50 reads out the signal output to the column signal line 12.

In the above example, each assist drive circuit 34 is connected to the second end of the reset control line RES[i] (first control line) so as to drive the reset control line RES[i] in accordance with the select control signal ΦSEL[i] (second control signal) supplied to the select control line SEL[i] (second control line). Instead of this, each assist drive circuit 34 is connected to the second end of the transfer control line TX[i] (first control line) so as to drive the transfer control line TX[i] in accordance with the select control signal ΦSEL[i] (second control signal) supplied to the select control line SEL[i] (second control line). In this case, when the buffer circuit 223 drives transfer control line TX[i], the assist drive circuit 34 can be configured to assist that driving. For example, when the buffer circuit 223 drives the transfer control line TX[i] at high logic level, the assist drive circuit 34 can be configured to assist that driving. Moreover, for example, when the buffer circuit 223 drives the transfer control line TX[i] at low logic level, the assist drive circuit 34 can be configured to assist that driving.

Figure 3:
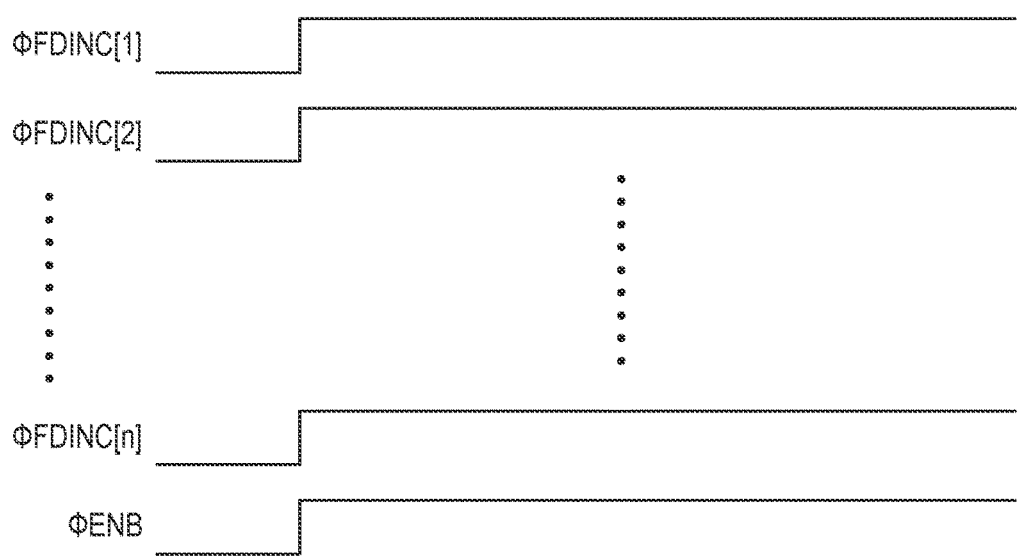
FIG. 3 is a sequence chart showing sensitivity control signals ΦFDINC[1] to ΦFDINC[n] on the first to nth rows and a control signal ENB according to the first embodiment of the present invention.

FIG. 3 shows the sensitivity control signals ΦFDINC[1] to ΦFDINC[n] on the first to nth rows and the control signal ENB. The sensitivity control signals ΦFDINC[1] to ΦFDINC[n] are generated by the row drive circuit 20. The control signal ENB is generated by the control circuit 40 as a signal common to the first to nth rows and supplied to the assist circuit 30 (second assist drive circuits 37). Consequently, the second assist drive circuits 37 on the first row to the nth row drive the sensitivity control lines FDINC[1] to FDINC[n] on the first row to the nth row from the second voltage VL to the first voltage VDD simultaneously. Note that such driving is merely an example, and an arrangement may be changed such that an period in which the second assist drive circuits 37 on the first row to the nth row drive the sensitivity control lines FDINC[1] to FDINC[n] on the first row to the nth row from the second voltage VL to the first voltage VDD simultaneously exists.

An arrangement in which the buffer circuits 225 of the row drive circuit 20 and the second assist drive circuits 37 of the assist circuit 30 drive the respective sensitivity control signals ΦFDINC[1] to ΦFDINC[n] on the first row to the nth row is advantageous in reducing crosstalk and smear.

Figure 4:
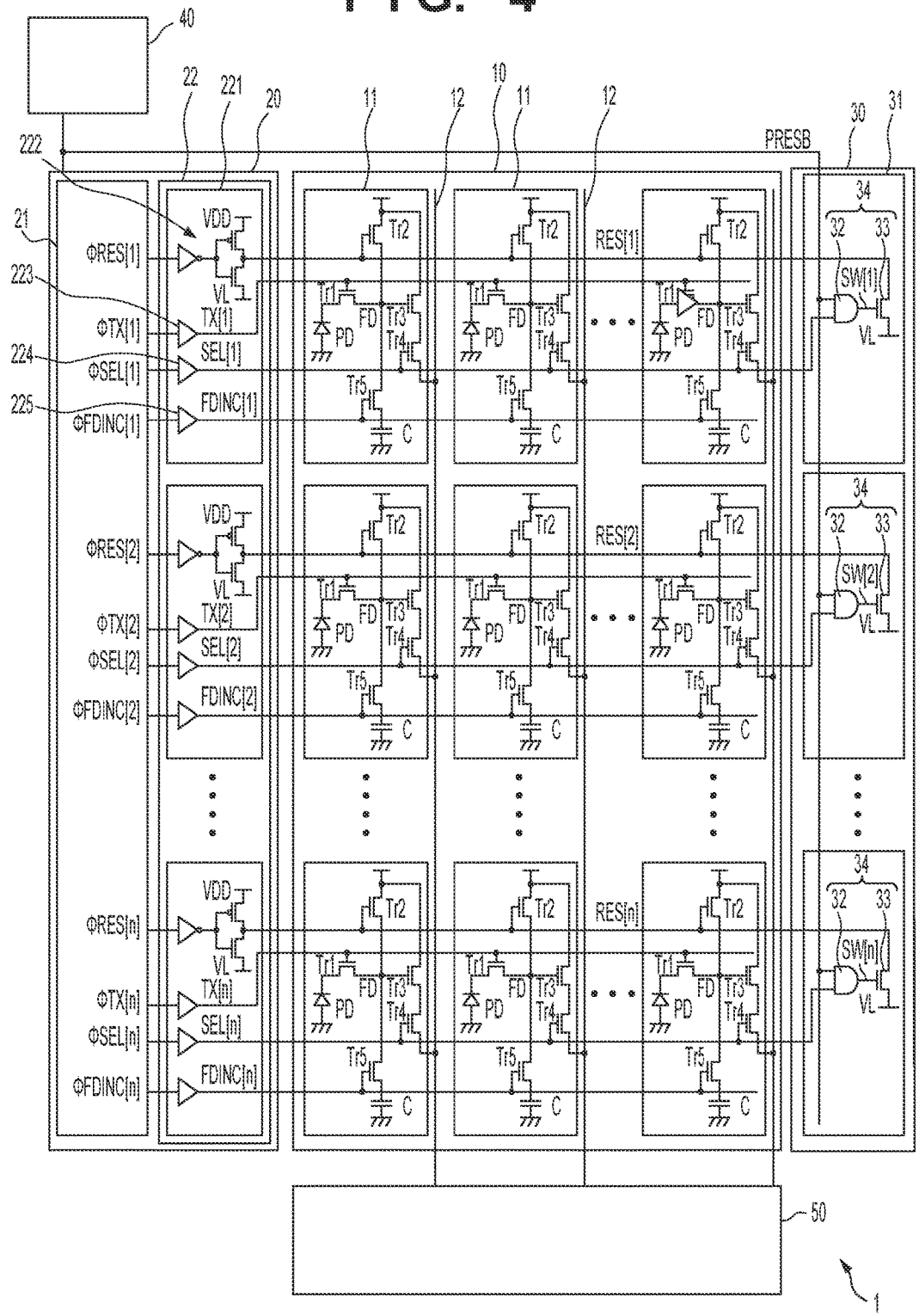
FIG. 4 is a circuit diagram showing the arrangement of an image sensing device according to a second embodiment of the present invention.
Figure 5:
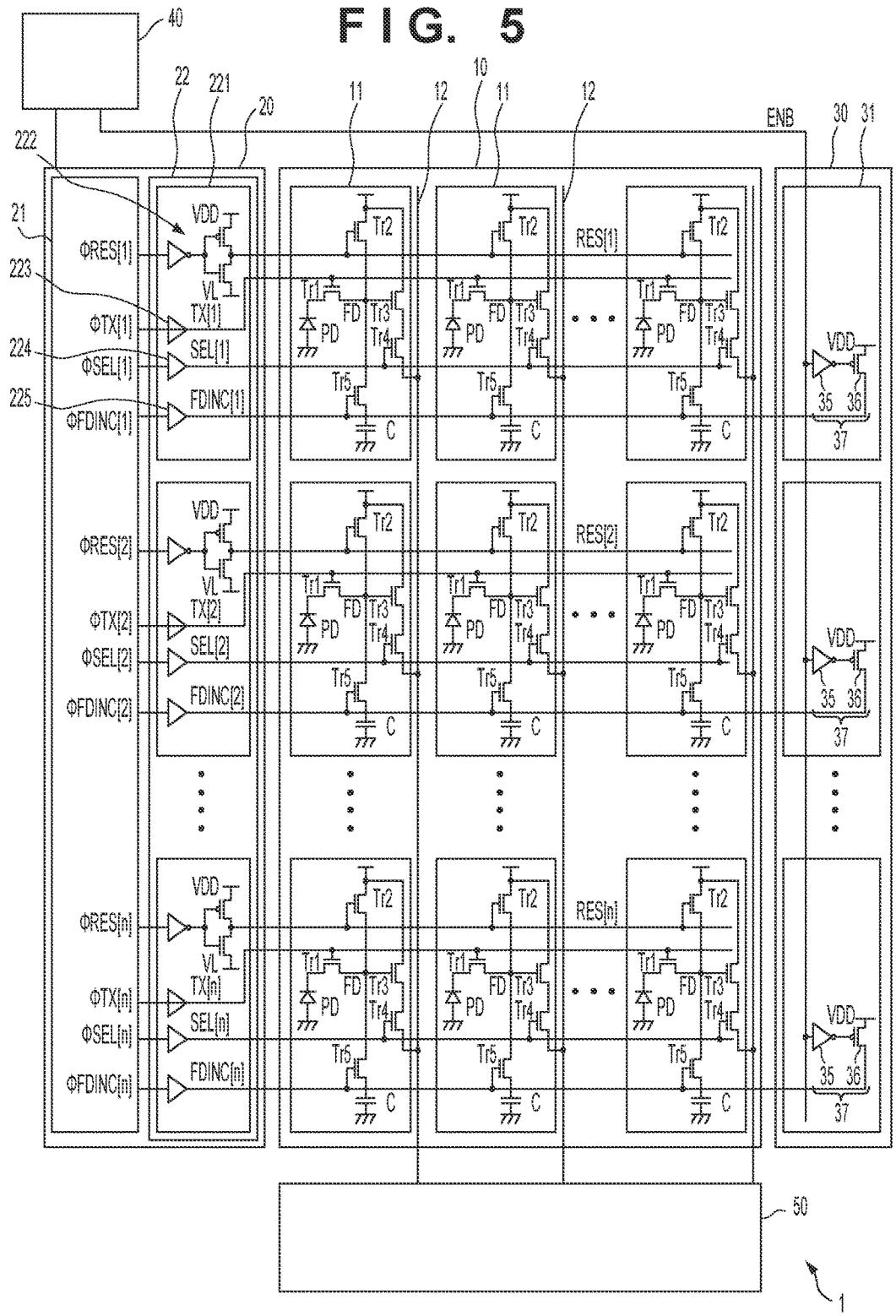
FIG. 5 is a circuit diagram showing the arrangement of an image sensing device according to a third embodiment of the present invention.

FIG. 4 shows the arrangement of an image sensing device 1 according to the second embodiment of the present invention. The image sensing device 1 of the second embodiment has an arrangement obtained by removing second assist drive circuits 37 from the image sensing device 1 of the first embodiment shown in FIG. 1. FIG. 5 shows the arrangement of an image sensing device 1 according to the third embodiment of the present invention. The image sensing device 1 of the third embodiment has an arrangement obtained by removing assist drive circuits 34 from the image sensing device 1 of the first embodiment shown in FIG. 1.

Figure 6A:
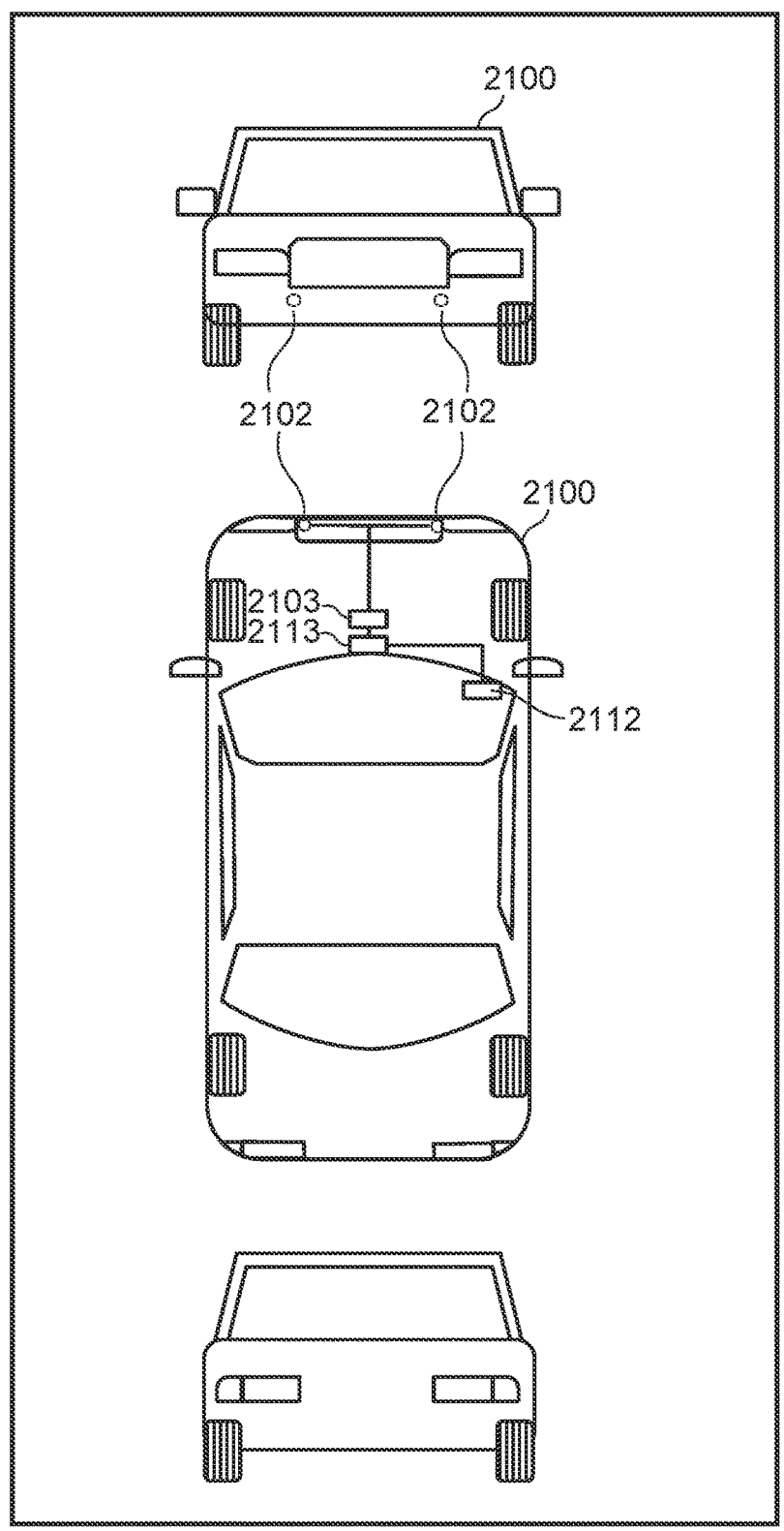
FIGS. 6A and 6B are a view and a block diagram each showing the arrangement of a moving apparatus as an application example of the present invention.

An example in which the image sensing device 1 is applied to a moving apparatus will be described below. The moving apparatus is, for example, an automobile that includes an onboard camera. FIG. 6A schematically shows the outer appearance and main internal structure of an automobile 2100. The automobile 2100 includes an image sensing device 2102, an image sensing system ASIC (Application Specific Integrated Circuit) 2103, a warning device 2112, and a main control unit 2113.

The image sensing device 1 represented by each of the above-described first to third embodiments is used for the image sensing device 2102. Upon receiving a signal representing an abnormality from an image sensing system, a vehicle sensor, a control unit, or the like, the warning device 2112 gives a warning to a driver. The main control unit 2113 generally controls the operations of the image sensing system, the vehicle sensor, the control unit, and the like. Note that the automobile 2100 need not always include the main control unit 2113. In this case, the image sensing system, the vehicle sensor, and the control unit include communication interfaces individually, and each of them transmits/receives a control signal via a communication network (for example, CAN standard).

Figure 6B:
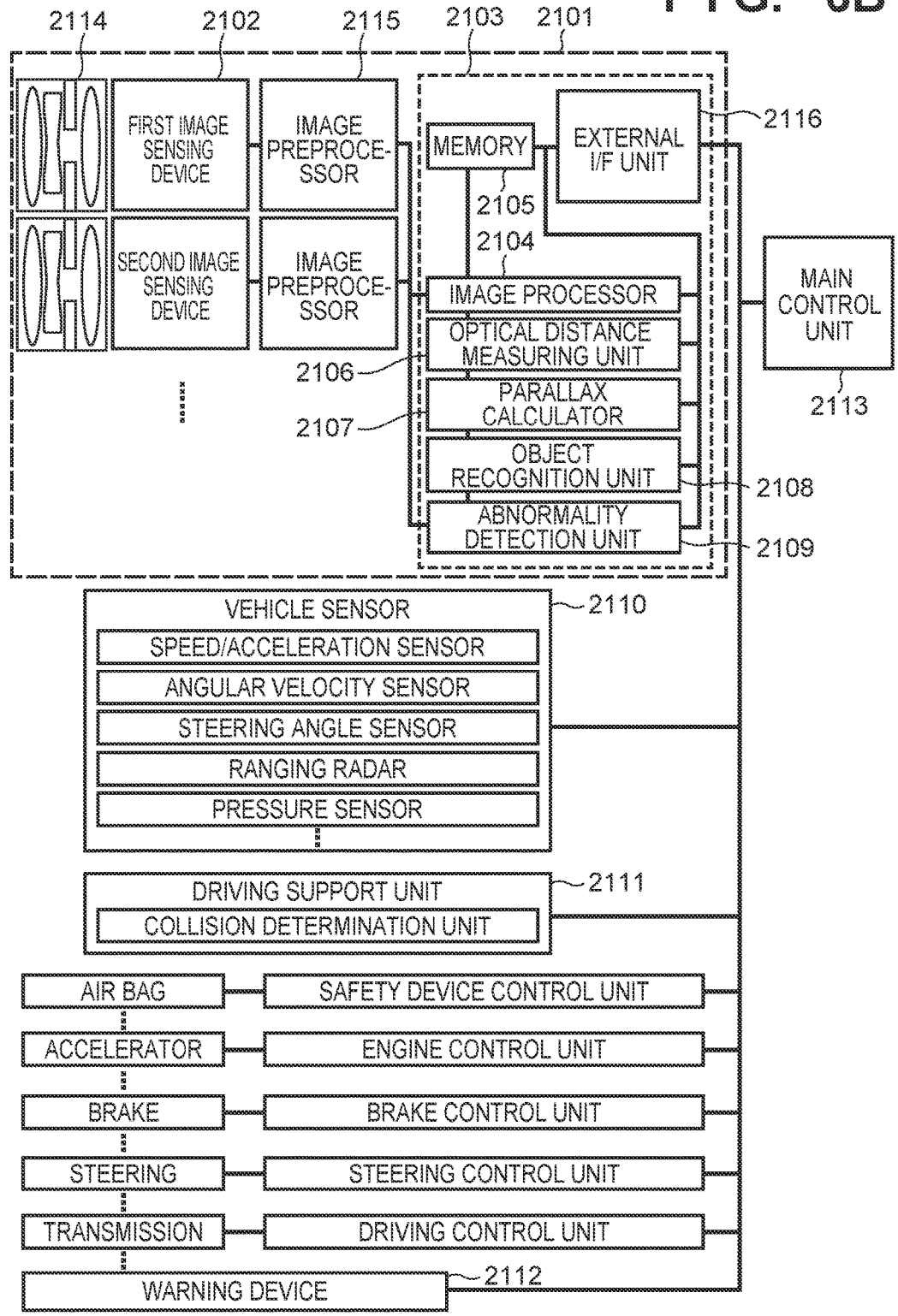

FIG. 6B is a block diagram showing the system arrangement of the automobile 2100. The automobile 2100 includes the first image sensing device 2102 and the second image sensing device 2102. That is, the onboard camera of the embodiment is a stereo camera. An object image is formed on the image sensing device 2102 by an optical unit 2114. A pixel signal output from the image sensing device 2102 is processed by an image preprocessor 2115 and transmitted to the image sensing system ASIC 2103. The image preprocessor 2115 performs processing such as S-N calculation or synchronization signal addition.

The image sensing system ASIC 2103 includes an image processor 2104, a memory 2105, an optical distance measuring unit 2106, a parallax calculator 2107, an object recognition unit 2108, an abnormality detection unit 2109, and an external interface (I/F) unit 2116. The image processor 2104 processes the pixel signal to generate an image signal. The image processor 2104 also performs correction of an image signal or complements an abnormal pixel. The memory 2105 temporarily holds the image signal. The memory 2105 may store the position of a known abnormal pixel of the image sensing device 2102. The optical distance measuring unit 2106 performs focusing or distance measurement of the object using the image signal. The parallax calculator 2107 performs object collation (stereo matching) of a parallax image. The object recognition unit 2108 analyzes the image signal and recognizes objects such as an automobile, a person, a signpost, and a road. The abnormality detection unit 2109 detects a fault or an operation error of the image sensing device 2102. Upon detecting a fault or an operation error, the abnormality detection unit 2109 sends a signal representing detection of the abnormality to the main control unit 2113. The external I/F unit 2116 mediates information exchange between the respective units of the image sensing system ASIC 2103 and the main control unit 2113, various control units, or the like.

The automobile 2100 includes a vehicle information acquisition unit 2110 and a driving support unit 2111. The vehicle information acquisition unit 2110 includes vehicle sensors such as a speed/acceleration sensor, an angular velocity sensor, a steering angle sensor, a ranging radar, and a pressure sensor.

The driving support unit 2111 includes a collision determination unit. The collision determination unit determines, based on pieces of information from the optical distance measuring unit 2106, the parallax calculator 2107, and the object recognition unit 2108, whether there is possibility of collision against an object. The optical distance measuring unit 2106 and the parallax calculator 2107 are examples of a distance information acquisition means for acquiring distance information to a target. That is, the distance information is information about a parallax, a defocus amount, and a distance up to the target. The collision determination unit may determine the collision possibility using one of these pieces of distance information. The distance information acquisition means may be implemented by hardware designed for a special purpose or may be implemented by a software module.

An example in which the driving support unit 2111 controls the automobile 2100 so it does not collide against another object has been described. However, it is also applicable to control of automatic driving following another vehicle or control of automatic driving not to drive off a lane.

The automobile 2100 also includes driving units used for driving such as an air bag, an accelerator, a brake, a steering, and a transmission. The automobile 2100 also includes control units for these units. Each control unit controls a corresponding driving unit based on a control signal of the main control unit 2113.

The image sensing system used in the embodiments is applicable not only to an automobile but also to, for example, a moving apparatus such as ship, an airplane, or an industrial robot. The image sensing system is also applicable not only to a moving apparatus but also widely to a device using object recognition such as an ITS (Intelligent Transportation System).

As described above, in the embodiments of the automobile, the image sensing device of one of the above-described first to third embodiments is used for the image sensing device 2102. According to this arrangement, it is possible to increase a test coverage ratio.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2017-059690, filed Mar. 24, 2017 which is hereby incorporated by reference herein in its entirety.

What is claimed is:

1. An image sensing device comprising:
a plurality of pixels arrayed so as to form a plurality of rows and a plurality of columns;
a plurality of sets of control lines respectively assigned to the plurality of rows such that one set of control lines is connected to one of the plurality of rows;
a row drive circuit configured to drive the plurality of sets of control lines; and
an assist circuit,
wherein each set of the plurality of sets of control lines includes a first control line and a second control line,
the row drive circuit includes a first drive circuit connected to a first end of the first control line of a corresponding set of control lines out of the plurality of sets of control lines and a second drive circuit connected to a first end of the corresponding second control line, and
the assist circuit includes a plurality of assist drive circuits each connected to a second end of the first control line of the corresponding set of control lines out of the plurality of sets of control lines, each of the plurality of assist drive circuits being configured to drive the corresponding first control line in accordance with a control signal supplied to the corresponding second control line by the second drive circuit and a second signal which is different from the control signal and different from a signal on the corresponding first control line, the second signal defining a period during which the assist drive circuit drives the corresponding first control line toward a predetermined voltage.

2. The device according to claim 1, wherein in a case where the first drive circuit drives a respective one of the first control lines from a first voltage to a second voltage, the corresponding assist drive circuit drives the respective first control line from the first voltage to the second voltage.

3. The device according to claim 2, wherein each of the assist drive circuits includes a transistor connected between the second end of the respective first control line and a node configured to supply the second voltage, and
each of the assist drive circuits drives the respective first control line by turning on the transistor.

4. The device according to claim 1, wherein a time duration signal is driven is supplied to the row drive circuit and the assist circuit.

5. The device according to claim 4, wherein the first drive circuit is configured to supply a first pulse signal defining a first period to the first control line,
the second drive circuit is configured to supply a second pulse signal defining a second period to the second control line as the first control signal, and
the entire first period belongs to the second period.

6. The device according to claim 5, wherein the time duration signal is a third pulse signal defining a third period, and
the entire third period belongs to the second period.

7. The device according to claim 6, wherein the third period is equal to the first period.

8. The device according to claim 1, wherein each of the plurality of pixels includes a photoelectric converter, a charge voltage converter, a transfer portion configured to transfer charges generated in the photoelectric converter to the charge voltage converter, and a reset portion configured to reset a voltage of the charge voltage converter, and the respective first control line is connected to the reset portion so as to control the reset portion.

9. The device according to claim 8, wherein each of the plurality of pixels further includes a selection portion, and a pixel that includes the selection portion out of the plurality of pixels is selected by activating the selection portion, and the respective second control line is connected to the selection portion so as to control the selection portion.

10. An image sensing device comprising:
a plurality of pixels arrayed so as to form a plurality of rows and a plurality of columns, each of the plurality of pixels including a photoelectric converter, a charge voltage converter, a transfer portion configured to transfer charges generated in the photoelectric converter to the charge voltage converter, and a reset portion configured to reset a voltage of the charge voltage converter, the charge voltage converter including a charge voltage conversion node and a switch configured to change a capacitance of the charge voltage conversion node;
a plurality of sets of control lines respectively assigned to the plurality of rows such that one set of control lines is connected to one of the plurality of rows;
a row drive circuit configured to drive the plurality of sets of control lines; and
an assist circuit,
wherein each set of the plurality of sets of control lines includes a first control line connected to the reset portion so as to control the reset portion, a second control line, and a third control line for controlling the switch of a pixel on a corresponding row out of the plurality of rows,
the row drive includes a plurality of first drive circuits each connected to a first end of the first control line of a corresponding set of control lines out of the plurality of sets of control lines, a plurality of second drive circuits each connected to a first end of the second control line of the corresponding set of control lines, and a plurality of third drive circuits each connected to a first end of the third control line of the corresponding set of control lines, and
the assist circuit includes a plurality of first assist drive circuits each connected to a second end of the first control line of the corresponding set of control lines out of the plurality of sets of control lines so as to drive the first control line in accordance with a control signal supplied to the corresponding second control line, a plurality of second assist drive circuits each connected to a second end of the third control line of the corresponding set of control lines so as to drive the third control line.

11. The device according to claim 10, wherein the plurality of second assist drive circuits are configured to drive the respective third control lines of the plurality of sets of control lines in response to a control signal commonly generated to the plurality of second assist drive circuits.

12. The device according to claim 11, wherein the plurality of second assist drive circuits are configured such that a period in which the respective third control lines of the plurality of sets of control lines are driven simultaneously by the plurality of second assist drive circuits exists.

13. An image sensing device comprising:
a plurality of pixels arrayed so as to form a plurality of rows and a plurality of columns;
a plurality of sets of control lines respectively assigned to the plurality of rows such that one set of control lines is connected to one of the plurality of rows;

a row drive circuit configured to drive the plurality of sets of control lines; and an assist circuit, wherein each of the plurality of pixels includes a photoelectric converter, a charge voltage converter, a transfer portion configured to transfer charges generated in the photoelectric converter to the charge voltage converter, and a reset portion configured to reset a voltage of the charge voltage converter, the charge voltage converter includes a charge voltage conversion node and a switch configured to change a capacitance of the charge voltage conversion node, each set of the plurality of sets of control lines further includes a switch control line for controlling the switch of a pixel on a corresponding row out of the plurality of rows, the row drive circuit includes a plurality of drive circuits, and each of the plurality of drive circuits is connected to a first end of the switch control line of a corresponding set of control lines out of the plurality of sets of control lines so as to drive the switch control line, and the assist circuit includes a plurality of assist drive circuits, and each of the plurality of assist drive circuits is connected to a second end of the switch control line of a corresponding set of control lines out of the plurality of sets of control lines so as to drive the switch control line.

14. The device according to claim 13, wherein in a case where a corresponding drive circuit out of the plurality of drive circuits drives the corresponding control line out of the plurality of control lines to a first voltage, each of the plurality of assist drive circuits drives the corresponding control line to the first voltage.

15. The device according to claim 14, wherein each of the plurality of assist drive circuits includes a transistor connected between the second end of the corresponding control line and a node configured to supply the first voltage, and the corresponding control line is driven by turning on the transistor.

16. The device according to claim 13, wherein the plurality of assist drive circuits are configured to drive the respective control lines of the plurality of sets of control lines in response to a control signal commonly generated to the plurality of assist drive circuits.

17. The device according to claim 16, wherein the plurality of second assist drive circuits are configured such that a period in which the control lines respectively belonging to the respective sets of the plurality of sets of control lines are driven simultaneously by the plurality of assist drive circuits exists.

18. A moving apparatus comprising:
an image sensing device defined in claim 1; and
an integrated circuit configured to process a signal output from the image sensing device.

19. A moving apparatus comprising:
an image sensing device defined in claim 13; and
an integrated circuit configured to process a signal output from the image sensing device.

20. The device according to claim 1, wherein the plurality of pixels are arranged between the assist circuit and the row drive circuit which includes the first drive circuit and the second drive circuit.

21. The device according to claim 1, wherein each of the plurality of assist drive circuits includes a logic gate configured to receive the control signal supplied to the corresponding second control line and the second signal, and to generate a signal to drive the corresponding first control line.

22. The device according to claim 13, wherein the row drive circuit is configured to select pixels on a row from the plurality of pixels, and the device further comprises a readout circuit configured to read out signals from the selected pixels of the row.

23. An image sensing device comprising:
a plurality of pixels arrayed so as to form a plurality of rows and a plurality of columns;

a plurality of sets of control lines respectively assigned to the plurality of rows such that one set of control lines is connected to one of the plurality of rows;

a row drive circuit configured to drive the plurality of sets of control lines; and an assist circuit, wherein each set of the plurality of sets of control lines includes a first control line and a second control line, the row drive circuit includes a first drive circuit connected to a first end of the first control line and a second drive circuit connected to first end of the second control line, the assist circuit includes a plurality of assist drive circuits each connected to a second end of the first control line of the corresponding set of control lines out of the plurality of sets of control lines, each of the plurality of assist drive circuits being configured to drive the corresponding first control line in accordance with a control signal supplied to the corresponding second control line, and the plurality of pixels are arranged between the assist circuit and the row drive circuit which includes the first drive circuit and the second drive circuit.

* * * * *